United States Patent
Chen et al.

(10) Patent No.: US 11,937,414 B2
(45) Date of Patent: Mar. 19, 2024

(54) DISPLAY ASSEMBLY AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Qizhong Chen, Beijing (CN); Bing Ji, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/194,042

(22) Filed: Mar. 31, 2023

(65) Prior Publication Data

US 2023/0240058 A1    Jul. 27, 2023

Related U.S. Application Data

(63) Continuation of application No. 17/271,466, filed as application No. PCT/CN2020/094443 on Jun. 4, 2020, now Pat. No. 11,647,616.

(51) Int. Cl.
   *H05K 1/18* (2006.01)
   *H01L 23/552* (2006.01)
   (Continued)

(52) U.S. Cl.
   CPC ......... *H05K 9/0024* (2013.01); *H01L 23/552* (2013.01); *H05K 9/0054* (2013.01);
   (Continued)

(58) Field of Classification Search
   CPC ......... H05K 2201/05; H05K 2201/051; H05K 2201/052; H05K 2201/053;
   (Continued)

(56) References Cited

U.S. PATENT DOCUMENTS

| 10,306,766 B2 * | 5/2019 | Shi ................... H10K 59/131 |
| 2015/0230331 A1 | 8/2015 | Lee |

FOREIGN PATENT DOCUMENTS

| CN | 103268168 A | 8/2013 |
| CN | 101625463 B | 5/2014 |

(Continued)

OTHER PUBLICATIONS

Notice of Allowance from U.S. Appl. No. 17/271,466 dated Jan. 11, 2023.

(Continued)

*Primary Examiner* — Binh B Tran
(74) *Attorney, Agent, or Firm* — ArentFox Schiff LLP; Michael Fainberg

(57) ABSTRACT

The display assembly includes a display module, a flexible printed board, an integrated circuit chip, and a composite tape. The integrated circuit chip and a binding portion of the flexible printed board are respectively in binding connection with the display module. The composite tape includes: a conductive fabric layer comprising a first part and a second part, the first part covering the integrated circuit chip and the binding portion, and the second part covering at least part of a grounding portion of the flexible printed board; and an insulating film layer on a side of the conductive fabric layer facing the integrated circuit chip and the flexible printed board, and including a third part, which is at the first part of the conductive fabric layer and covering the integrated circuit chip and the binding portion, and the insulating film layer avoiding the at least part of the grounding portion.

20 Claims, 5 Drawing Sheets

(51) Int. Cl.
*H05K 9/00* (2006.01)
*H01L 25/18* (2023.01)

(52) U.S. Cl.
CPC .............. *H01L 25/18* (2013.01); *H05K 1/189* (2013.01); *H05K 9/009* (2013.01); *H05K 2201/10128* (2013.01)

(58) Field of Classification Search
CPC ....... H05K 2201/055; H05K 2201/056; H05K 2201/057; H05K 2201/058; H05K 1/147; H05K 1/028; H05K 1/189
USPC ........................................................ 361/749
See application file for complete search history.

(56) References Cited

FOREIGN PATENT DOCUMENTS

| CN | 104835804 A | 8/2015 |
| CN | 210042723 U | 2/2020 |
| CN | 210606462 U | 5/2020 |

OTHER PUBLICATIONS

International Search Report mailed in PCT/CN2020/094443 dated Feb. 23, 2021.

\* cited by examiner

DISPLAY ASSEMBLY AND DISPLAY DEVICE

CROSS REFERENCE TO RELATED APPLICATIONS

This application is a continuation of U.S. patent application Ser. No. 17/271,466, filed on Feb. 25, 2021, which is a National Stage of International Application No. PCT/CN2020/094443, filed on Jun. 4, 2020. The afore-mentioned patent applications are hereby incorporated by reference in their entireties.

FIELD

The present application relates to the field of display technology, in particular to a display assembly and a display device.

BACKGROUND

As display components of electronic equipment, OLED display devices have been widely used in various electronic products, and an OLED display panel is an important component of a display device. To protect a drive integrated circuit chip (Drive IC) and a main flexible printed board (MFPC) of an OLED display module, generally a tape (IC Cover Tape) is attached to the upper parts of the MFPC and the Drive IC. At present, the IC Cover Tape is relatively simple in structural design, has a poor protective effect on the MFPC and the Drive IC, and cannot effectively guarantee the yield of the MFPC and the Drive IC.

SUMMARY

This application discloses a display assembly and a display device, with an objective of improving a protective effect on a drive integrated circuit chip and a flexible printed board, and increasing the yield of a display product.

To achieve the above objective, this application provides the following technical solution.

A display assembly includes a display module, a flexible printed board, an integrated circuit chip, and a composite tape. The integrated circuit chip and a binding portion of the flexible printed board are respectively in binding connection with the display module.

The composite tape is located in a binding area of the display module and is pasted on the integrated circuit chip and the flexible printed board; and the composite tape includes a conductive fabric layer and an insulating film layer.

The conductive fabric layer includes a first part and a second part, the first part being configured to cover the integrated circuit chip and the binding portion of the flexible printed board, and the second part being configured to cover at least part of a grounding portion of the flexible printed board.

The insulating film layer is located on a side of the conductive fabric layer facing the integrated circuit chip and the flexible printed board, the insulating film layer including a third part, which is located at the first part of the conductive fabric layer and covers the integrated circuit chip and the binding portion of the flexible printed board, and the insulating film layer avoiding the at least part of the grounding portion of the flexible printed board.

Optionally, the third part of the insulating film layer is configured to cover a border of the binding portion of the flexible printed board and completely cover the integrated circuit chip, and is adhered to the display module.

Optionally, the composite tape further includes:

a wave absorbing material layer located on a side of the insulating film layer away from the conductive fabric layer, and at the third part of the insulating film layer, and configured to cover the integrated circuit chip.

Optionally, the shape of the wave absorbing material layer is similar to that of the integrated circuit chip, and the wave absorbing material layer is configured to completely cover the integrated circuit chip.

Optionally, the composite tape further includes:

a double-sided adhesive layer located on a side of the wave absorbing material layer away from the insulating film layer, an edge of the double-sided adhesive layer being beyond an edge of the wave absorbing material layer and being adhered to the insulating film layer.

Optionally, the grounding portion includes a first grounding portion close to the binding portion and a second grounding portion away from the binding portion.

The second part of the conductive fabric layer is configured to cover the first grounding portion and be adhered to the first grounding portion.

Optionally, the conductive fabric layer is configured to avoid the second grounding portion.

Optionally, the conductive fabric layer further includes a fourth part configured to cover a test portion of the flexible printed board.

The insulating film layer includes a fifth part located at the fourth part of the conductive fabric layer and configured to cover the test portion of the flexible printed board.

Optionally, the flexible printed board is L-shaped and includes a first extension portion and a second extension portion, the first extension portion including the binding portion, the test portion and the first grounding portion, and the second extension portion including the second grounding portion and a component portion.

The conductive fabric layer is configured to at least cover part of the first extension portion and avoid the second grounding portion and the component portion of the second extension portion.

The insulating film layer is configured to cover part of the first extension portion.

Optionally, in the first extension portion, the binding portion includes a one-layer metal wiring board, and an edge area on a side opposite to the binding portion includes a three-layer metal wiring board, and other areas include a six-layer metal wiring board; and the second extension includes a six-layer metal wiring board.

Optionally, the conductive fabric layer is configured such that an edge of a side thereof away from the binding portion of the flexible printed board is spaced from the component portion of the flexible printed board by a distance of 4.7 mm-4.8 mm, and edges of left and right sides thereof are spaced from borders of left and right sides of the flexible printed board by a distance of 1.2 mm-1.3 mm; and the borders of the left and right sides are borders of two ends in an extending direction of the first extension portion.

Optionally, the insulating film layer is made of a polyester film.

Optionally, the insulating film layer has a thickness of 0.009 mm-0.011 mm.

Optionally, the display module includes a flexible display panel, the flexible display panel having a binding area, which is bendable to the back of the display module.

The binding portion of the flexible printed board and the integrated circuit chip are respectively in binding connection with the binding area of the flexible display panel.

The composite tape covers part of the binding area of the flexible display panel and is adhered to the part of the binding area.

Optionally, the display module includes a display panel and a flexible connecting board with one end in binding connection with the display panel, the flexible connecting board having a binding area, which is bendable to the back of the display module.

The binding portion of the flexible printed board and the integrated circuit chip are respectively in binding connection with the binding area of the flexible connecting board.

The composite tape covers part of the binding area of the flexible connecting board and is adhered to the part of the binding area.

A display device including the display assembly in any of the above implementations.

DETAILED DESCRIPTION OF THE EMBODIMENTS

Figure 1:
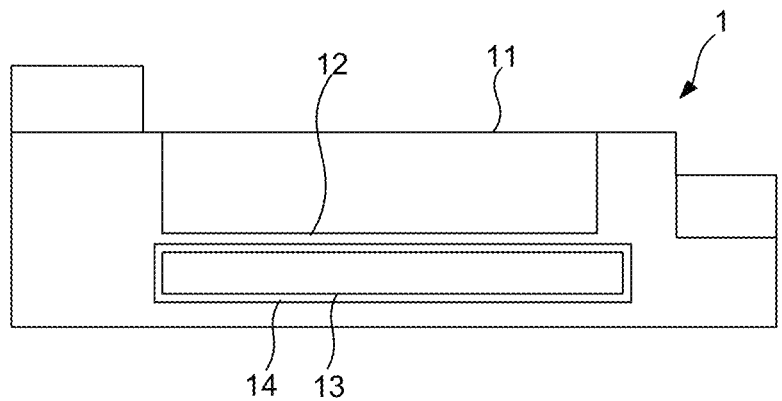
FIG. 1 is a structural diagram of a composite tape provided in an embodiment of the present application.

Technical solutions in embodiments of this application will be described below clearly and completely in conjunction with the accompanying drawings in the embodiments of the application. Obviously, the described embodiments are only a part of embodiments of the application, and not all embodiments. Based on the embodiments in the application, all other embodiments obtained by those of ordinary skill in the art without any creative work fall within the protection scope of the application.

As shown in FIGS. 1 to 4, embodiments of the application provide a composite tape 1 configured to be adhered to a binding area of a display assembly. The display assembly includes a display module 4, an integrated circuit chip 3, and a flexible printed board 2. The integrated circuit chip 3 and a binding portion 21 of the flexible printed board 2 are respectively in binding connection with the display module 4. The composite tape 1 includes a conductive fabric layer 11 and an insulating film layer 12.

The conductive fabric layer 11 includes a first part 11a and a second part 11b. The first part 11a is configured to cover the integrated circuit chip 3 and the binding portion 21 of the flexible printed board 2. The second part 11b is configured to cover at least part of a grounding portion (for example, a first grounding portion 22 in FIGS. 3 and 4) of the flexible printed board 2. In some embodiments, the grounding portion refers to a conductive part exposed to the outside that can be used for grounding, for example, a copper exposure portion.

The insulating film layer 12 is located on a side, facing the integrated circuit chip 3 and the flexible printed board 2, of the conductive fabric layer 11. The insulating film layer 12 includes a third part 12c. The third part 12c is located at the first part 11a of the conductive fabric layer 11 and configured to cover the binding portion 21 of the flexible printed board 2 and the integrated circuit chip 3. The insulating film layer 12 avoids the at least part of the grounding portion (for example, the first grounding portion 22 in FIGS. 3 and 4) of the flexible printed board 2, that is, the insulating film layer 12 does not cover the above-mentioned at least part of the grounding portion.

The above-mentioned composite tape 1 has the conductive fabric layer 11 and the insulating film layer 12. The insulating film layer 12 avoids the at least part of the grounding portion (for example, the first grounding portion 22 in FIGS. 3 and 4) of the flexible printed board 2. The second part 11b of the conductive fabric layer 11 may directly cover the at least part of the grounding portion (for example, the first grounding portion 22 in FIGS. 3 and 4) of the flexible printed board 2, thereby achieving electrical connection between the conductive fabric layer 11 and the flexible printed board 2. Thus, on the one hand, the conductive fabric layer 11 can serve as an electromagnetic shielding layer to protect the flexible printed board 2 and the integrated circuit chip 3, and on the other hand, it can be beneficial to achieving the grounding of both the flexible printed board 2 and the composite tape 1. The insulating film layer 12 is located on the side of the conductive fabric layer 11 facing the integrated circuit chip 3 and the flexible printed board 2, and the third part 12c of the insulating film layer 12 is configured to cover the binding portion 21 of the flexible printed board 2 and the integrated circuit chip 3. On the one hand, the binding portion 21 of the flexible printed board 2 and the integrated circuit chip 3 can be isolated from the conductive fabric layer 11 to avoid a short circuit of the binding connection between the flexible printed board 2 or the integrated circuit chip 3 and the display module 4 due to the conductive fabric layer 11. On the other hand, the insulating film layer 12 can isolate water vapor and prevent water vapor from invading binding areas of the flexible printed board 2 and the integrated circuit chip 3, so that the yield of the binding connection can be effectively improved.

In summary, the above-mentioned composite tape 1 can improve a protective effect on the integrated circuit chip 3 and the flexible printed board 2, and increase the binding yield of the integrated circuit chip 3 and the flexible printed board 2, thereby increasing the yield of a display product.

In some embodiments, the conductive fabric layer 11 is a structural layer made of fibers which are pre-treated and electroplated with a metal coating to have metal properties. The insulating film layer 12 is a film layer with electrical insulation, high flexibility, and good waterproof performance, and for example may be of a polyester film material, such as Mylar.

Exemplarily, the thickness of the insulating film layer 12 may be about 0.01 mm. For example, it may be 0.009 mm-0.011 mm.

As shown in FIGS. 1 to 4, in some embodiments, the third part 12c of the insulating film layer 12 is configured to cover a border S of the binding portion 21 of the flexible printed board 2 and completely cover the integrated circuit chip 3, and is adhered to the display module 4.

The "border S of the binding portion 21 of the flexible printed board 2" refers to an edge of the flexible printed board 2 that overlaps the binding area 40 of the display module 4 and is consistent with an extension direction of a long edge of the binding area 40.

At present, limited by the size of a customer's complete machine, the distance between borders of binding areas of a drive integrated circuit chip (Drive IC) and a main flexible printed board 2 (MFPC) is generally about 0.55 mm, which does not meet a glue spreading distance (>0.65 mm) in a factory. Therefore, the borders of binding areas of the Drive IC and the MFPC are generally not applied with glue, so there is a risk that water vapor is likely to invade the binding areas of the Drive IC and the MFPC and causes rejects.

In embodiments of the application, the border S of the binding portion 21 of the flexible printed board 2 and the border of the binding area of the integrated circuit chip 3 are both covered by the insulating film layer 12 of the composite tape 1 and are packaged in an adhered manner. This can effectively avoid that water vapor invades the binding areas of the flexible printed board 2 and the integrated circuit chip 3, thus improving the yield of the binding connection.

Figure 2:
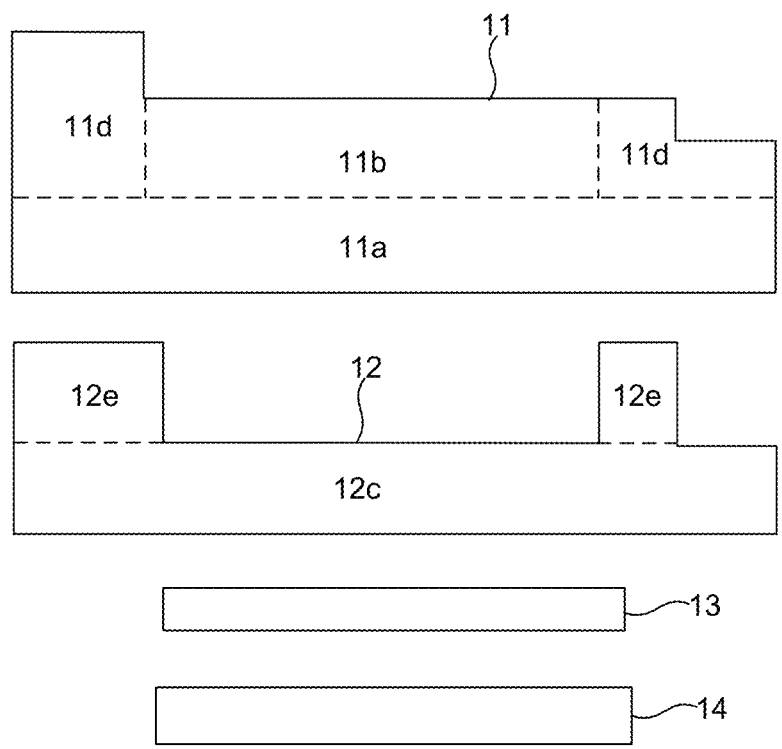
FIG. 2 is an exploded structural diagram of layers of the composite tape in FIG. 1.
Figure 3:
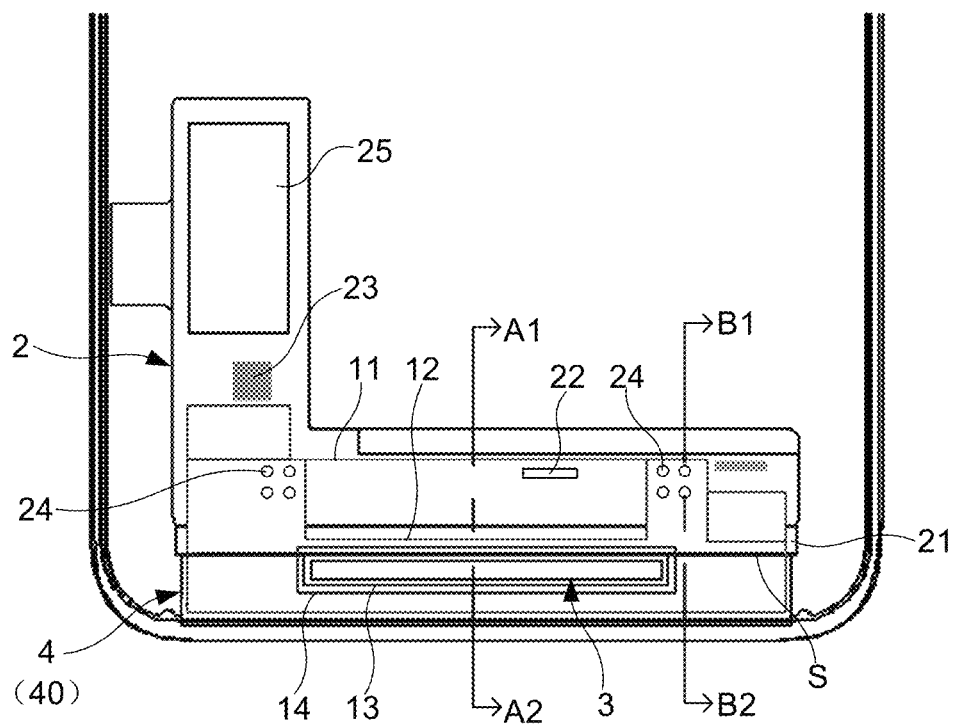
FIG. 3 is a structural diagram of a display assembly provided in an embodiment of the present application.

As shown in FIGS. 1 to 3, in some embodiments, the composite tape 1 of the application may further include a wave absorbing material layer 13. The wave absorbing material layer 13 is located on a side of the insulating film layer 12 away from the conductive fabric layer 11, and at the third part 12c of the insulating film layer 12, and configured to cover the integrated circuit chip 3.

Exemplarily, the shape of the wave absorbing material layer 13 is similar to that of the integrated circuit chip 3, and the wave absorbing material layer 13 is configured to completely cover the integrated circuit chip 3.

In some embodiments, the "shape similarity" includes cases of identical shapes and sizes, same shapes but different sizes, and roughly same shape outlines.

In some embodiments, the wave absorbing material refers to a type of material that can absorb or greatly weaken electromagnetic wave energy projected onto its surface to reduce electromagnetic wave interference. Exemplarily, the wave absorbing material layer in the application may be a solid powder material layer coagulated by a colloid. In some embodiments, the solid powder may be iron oxide powder or magnetic iron nano-powder.

The wave absorbing material layer 13 is located on the side of the insulating film layer 12 away from the conductive fabric layer 11 and covers the integrated circuit chip (Drive IC) 3, so that electromagnetic radiation can be effectively weakened, and electromagnetic radiation from the Drive IC 3 to the outside and the interference of external electromagnetic radiation on the Drive IC 3 are reduced.

As shown in FIGS. 1 to 3, in some embodiments, the composite tape 1 of the application may further include a double-sided adhesive layer 14. The double-sided adhesive layer 14 is located on a side of the wave absorbing material layer 13 away from the insulating film layer 12. Edges of the double-sided adhesive layer 14 are beyond edges of the wave absorbing material layer 13 and are adhered to the insulating film layer 12.

Figure 5:
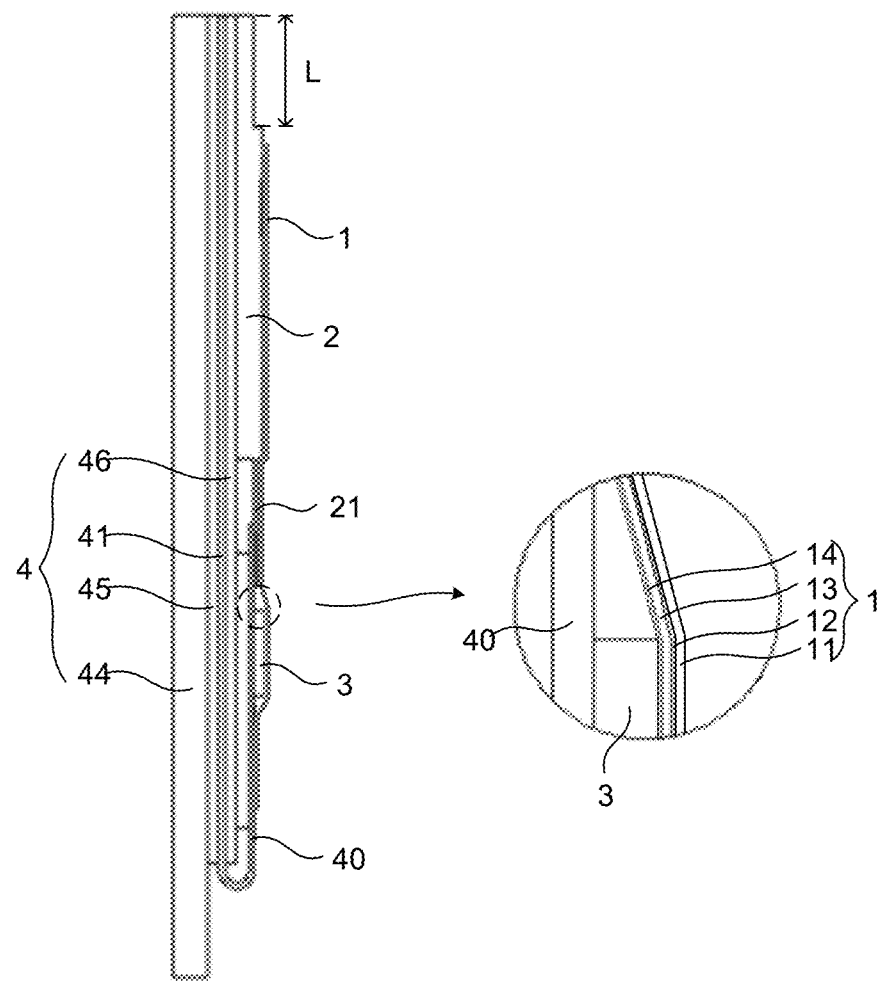
FIG. 5 is a structural diagram of a cross section along a direction A1-A2, and an enlarged diagram of part of the cross section, of the display assembly in FIG. 3.

That is, the composite tape 1 of the application includes four structural layers, as shown in FIGS. 3 and 5, the first layer (the uppermost layer) is the conductive fabric layer 11, the second layer is the insulating film layer 12, the third layer is the wave absorbing material layer 13, and the fourth layer is the double-sided adhesive layer 14. The double-sided adhesive layer 14 and the wave absorbing material layer 13 cover the Drive IC 3. The overall dimensions of the double-sided adhesive layer 14 are larger than the overall dimensions of the wave absorbing material layer 13, and the part of the double-sided adhesive layer 14 beyond the wave absorbing material layer 13 is directly attached to the insulating film layer 12 to enclose the wave absorbing material layer 13. This can prevent some powder Particles separated from the wave absorbing material layer 13 from adversely affecting the display product. In addition, one side of the double-sided adhesive layer 14 is attached to the Drive IC 3, and the other side of the double-sided adhesive layer 14 is attached to the wave absorbing material layer 13, so that the position of the wave absorbing material layer 13 relative to the Drive IC 3 can be fixed to prevent a reduction of a wave absorbing effect of the wave absorbing material due to a positional shift of the wave absorbing material layer 13.

Figure 4:
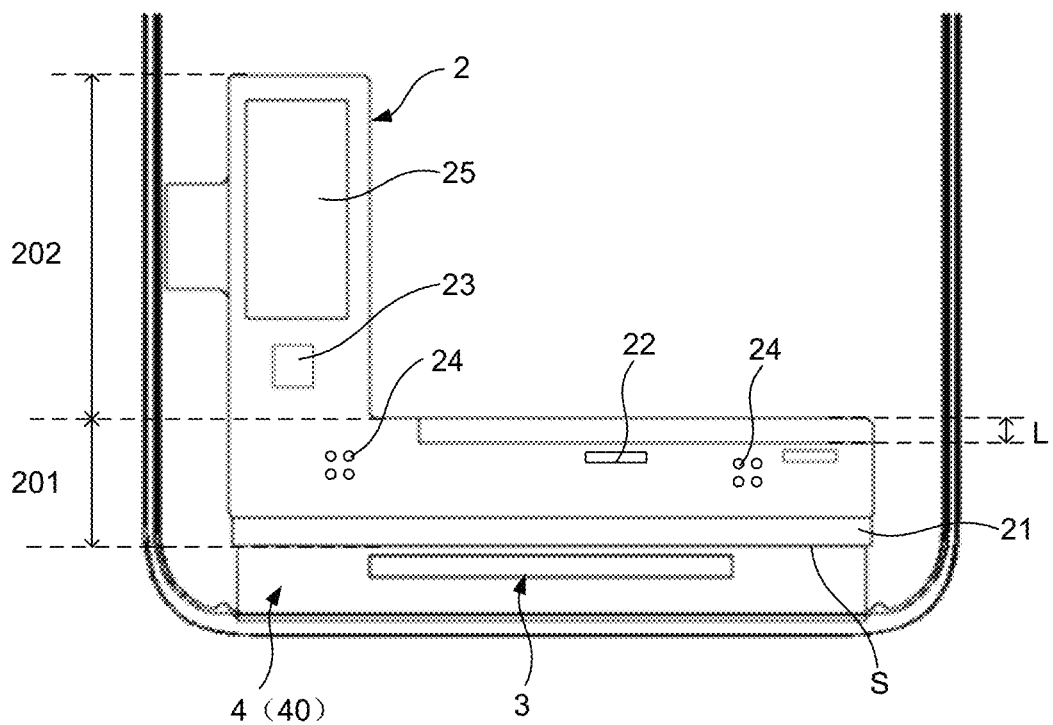
FIG. 4 is a partial structural diagram of the display assembly in FIG. 3.

As shown in FIGS. 3 and 4, in some embodiments, the grounding portion of the flexible printed board 2 may include a first grounding portion 22 close to the binding portion 21 and a second grounding portion 23 away from the binding portion 21.

Exemplarily, as shown in FIGS. 1 to 3, the second part 11b of the conductive fabric layer 11 is configured to cover the first grounding portion 22 and be adhered to the first grounding portion 22.

Exemplarily, as shown in FIGS. 1 to 3, the conductive fabric layer 11 is configured to avoid the second grounding portion 23 of the flexible printed board 2.

In other words, the conductive fabric layer 11 covers the first grounding portion 22 of the flexible printed board 2 and is electrically connected to the flexible printed board 2 through the first grounding portion 22, and the conductive fabric layer 11 exposes the second grounding portion 23 of the flexible printed board 2, so that the flexible printed board 2 can be grounded through the second grounding portion 23. For example, in the case where the display module 4 for binding connection is a mobile phone module, the second grounding portion 23 of the flexible printed board 2 can be electrically connected to a middle frame of a mobile phone to achieve grounding. Thus, the flexible printed board 2 may be grounded through the conductive fabric layer 11, and may also be grounded directly, to better ensure the circuit yield.

As shown in FIGS. 1 to 3, in some embodiments, in addition to the first part 11a covering the binding portion 21 of the flexible printed board 2 and the integrated circuit chip 3, and the second part 11b covering the grounding portion of the flexible printed board 2, the conductive fabric layer 11 may further include a fourth part 11d. The fourth part 11d is configured to cover the test portion of the flexible printed board 2.

Further, the insulating film layer 12 includes a fifth part 12e located at the fourth part 11d of the conductive fabric layer 11 and configured to cover the test portion of the flexible printed board 2.

Figure 6:
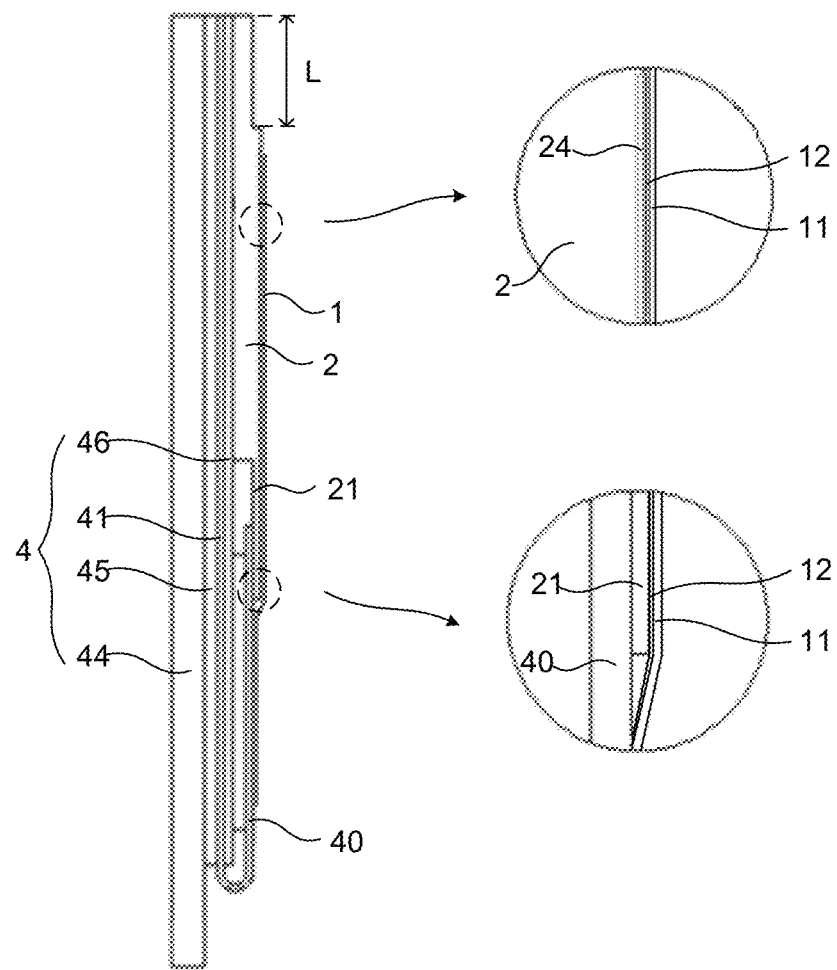
FIG. 6 is a structural diagram of a cross section along a direction B1-B2, and an enlarged diagram of part of the cross section, of the display assembly in FIG. 3.

In some embodiments, the test portion includes a plurality of test points 24 for automatic detection of a binding process section of a module production line (belonging to the front of line of the module), and as shown in FIGS. 3 and 6, after a module binding operation (belonging to the front of line of the module), the conductive fabric layer 11 and the insulating film layer 12 of the composite tape 1 cover the test portion (test points 24) of the flexible printed board 2, and can protect the test portion, and the insulating film layer 12 under the conductive fabric layer 11 isolates the conductive fabric layer 11 from the test points 24 to prevent the test points 24 from being brought into conduction with the conductive fabric layer 11.

As shown in FIG. 4, in some embodiments, the flexible printed board 2 is L-shaped and includes a first extension portion 201 and a second extension portion 202, the first extension portion 201 including the binding portion 21, the test portion (the test points 24) and the first grounding portion 22, and the second extension portion 202 including the second grounding portion 23 and a component portion 25.

In some embodiments, as shown in FIG. 3, the conductive fabric layer 11 is configured to at least cover part of the first extension portion 201 (such as covering the binding portion 21, the test portion and the first grounding portion 22) and avoid the second grounding portion 23 and the component portion 25 of the second extension portion 202, which means that the conductive fabric layer 11 does not cover the second grounding portion 23 and the component portion 25. The insulating film layer 12 is configured to cover part of the first extension portion 201 (such as covering the binding portion 21 and the test portion).

In some embodiments, as shown in FIGS. 3, and 5 to 7, a main body of the flexible printed board (MFPC) 2 is the thickest and generally has a 6-layer board. To ensure a space for the customer's complete machine, part of an area L of the MFPC 2 is provided with a 3-layer board. The binding portion 21 is generally provided with a 1-layer board to facilitate binding connection with the display module 4. Specifically, an n-layer board (n is 6, 3, or 1) means that n layers of metal wiring can be provided, which can be called an 'n-layer metal wiring board'.

Exemplarily, in the first extension portion 201, the binding portion 21 includes a one-layer metal wiring board, and the edge area L on a side opposite to the binding portion 21 includes a three-layer metal wiring board to reduce the thickness of the L area, so that a battery is convenient to assemble in complete machine assembly, and a space is preserved for assembling the battery. Other areas of the first extension portion 201 include a six-layer metal wiring board. The second extension portion 202 includes a six-layer metal wiring board.

In a specific embodiment, using specific orientations of up, down, left, and right in FIG. 3 as an example for description, as shown in FIGS. 1 and 3, the conductive fabric layer 11 is configured such that an edge of an upper side (an edge of a side away from the binding portion 21 of the flexible printed board 2) may be spaced from the component portion 25 of the flexible printed board 2 by a distance of approximately 4.7 mm-4.8 mm, for example about 4.772 mm, and edges of left and right sides may be spaced from borders of left and right sides of the flexible printed board 2 by a distance of approximately 1.2 mm-1.3 mm, for example about 1.256 mm. As shown in FIG. 3, the borders of the left and right sides of the flexible printed board 2 are borders of two ends in an extending direction of the first extension portion 201. As shown in FIGS. 1 and 2, in addition to that the insulating film layer 12 has no overlap with borders of the second part 11*b* of the conductive fabric layer 11, borders of other parts of the insulating film layer may overlap borders of the conductive fabric layer 11. Of course, the borders of the other parts of the insulating film layer 12 may also not overlap the borders of the conductive fabric layer 11. For example, the borders of the conductive fabric layer 11 may exceed the borders of the insulating film layer 12.

As shown in FIGS. 3 and 5 to 7, embodiments of the present application further provide a display assembly, which includes a display module 4, a flexible printed board 2, an integrated circuit chip 3, and a composite tape 1 in any of the above embodiments.

The binding portion 21 of the flexible printed board 2 and the integrated circuit chip 3 are respectively in binding connection with the display module 4.

The composite tape 1 is pasted on the integrated circuit chip 3 and the flexible printed board 2.

As shown in FIGS. 5 and 6, in some embodiments, the display module 4 includes a flexible display panel 41. The flexible display panel 41 has a binding area 40, which is bendable to the back of the display module 4.

In some embodiments, the binding portion 21 of the flexible printed board 2 and the integrated circuit chip 3 are respectively in binding connection with the binding area 40 of the flexible display panel 41. The composite tape 1 covers part of the binding area 40 of the flexible display panel 41 and is adhered to the part of the binding area 40.

In some embodiments, the binding area 40 of the application is not only an area of the flexible display panel 41 in contact connection with the flexible printed board 2 and the integrated circuit chip 3, and as shown in FIG. 6, the binding area 40 refers to the entire part of the flexible display panel 41 bent to the back of the display module 4.

Exemplarily, both the conductive fabric layer 11 and the insulating film layer 12 of the composite tape 1 cover the border of the binding portion 21 of the flexible printed board 2 and completely cover the integrated circuit chip 3, and overlap part of the binding area 40 of the display module 4, and the insulating film layer 12 is adhered to the part of the binding area 40.

Figure 7:
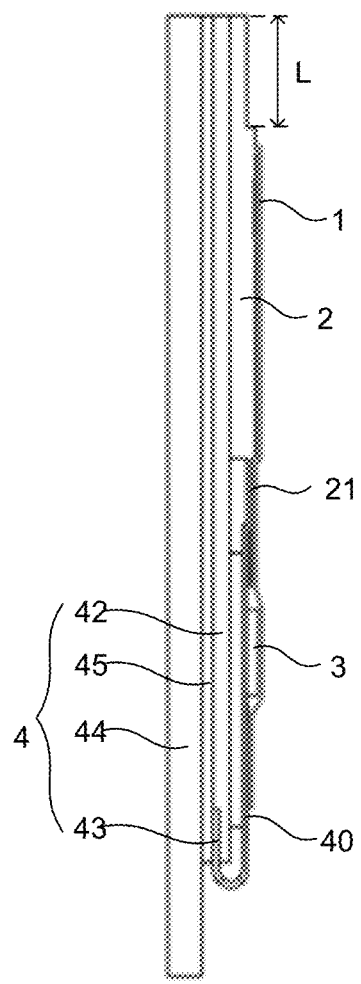
FIG. 7 is another structural diagram of a cross section along the direction A1-A2 of the display assembly in FIG. 3.

As shown in FIG. 7, in some other embodiments, the display module 4 includes a display panel 42 and a flexible connecting board 43 with one end in binding connection with the display panel 42. The flexible connecting board 43 has a binding area 40. The binding area 40 is bendable to the back of the display module 4. Exemplarily, the display panel 42 in the embodiments may be a rigid display panel.

In some embodiments, the binding portion 21 of the flexible printed board 2 and the integrated circuit chip 3 are respectively in binding connection with the binding area 40 of the flexible connecting board 43. The composite tape 1 covers part of the binding area 40 of the flexible connecting board 43 and is adhered to the part of the binding area 40.

Similar to the binding area of the flexible display panel in the above embodiments, as shown in FIG. 7, in some embodiments, the binding area 40 of the flexible connecting board 43 refers to the entire part of the flexible connecting board 43 bent to the back of the display module 4.

Exemplarily, both the conductive fabric layer 11 and the insulating film layer 12 of the composite tape 1 cover the border of the binding portion 21 of the flexible printed board 2 and completely cover the integrated circuit chip 3, and overlap part of the binding area 40 of the flexible connecting board 43, and the insulating film layer 12 is adhered to the part of the binding area 40.

In some embodiments, as shown in FIGS. 5 to 7, in the display assembly provided in the embodiments of the application, in addition to a display panel (for example, the flexible display panel 41 in FIGS. 5 and 6, or the display panel 42 in FIG. 7), the display module 4 may further include structures such as a glass cover plate 44 and a polarizer 45 on a light emergent side of the display panel, and a heat dissipation module 46 (not shown in FIG. 7) on the back of the display panel, which will not be described here.

In addition, the application further provides a display device including the display assembly in any of the above embodiments.

In some embodiments, the display device may be an OLED display device, and may specifically be a tablet computer, a mobile phone, or other display device.

It should be noted that in some embodiments of the disclosure, the display assembly and the display device may further include other structures, which may be determined according to actual requirements, and are not limited in embodiments of the disclosure. In addition, for specific application and arrangement of the composite tape provided in embodiments of the disclosure in the display assembly and the display device, reference may be made to the above description of the composite tape, which will not be repeated here.

Although preferred embodiments of the application have been described, additional variations and modifications of these embodiments can be made by those skilled in the art upon learning the basic inventive concept. It is therefore intended that the appended claims are interpreted as including the preferred embodiments and all such alterations and modifications that fall within the scope of the application.

It will be apparent to those skilled in the art that various modifications and variations can be made in embodiments of the application without departing from the spirit or scope of embodiments of the application. Thus, it is intended that the disclosure covers the modifications and variations if these modifications and variations of embodiments of the disclosure come within the claims of the disclosure and the scope of their equivalents.

What is claimed is:

1. A display assembly, comprising:
a display module;
a flexible printed board;
an integrated circuit chip; and
a composite tape
wherein the integrated circuit chip and a binding portion of the flexible printed board are respectively in binding connection with the display module;
the composite tape is located in a binding area of the display module and is pasted on the integrated circuit chip and the flexible printed board; and
the composite tape comprises:
a conductive fabric layer configured to cover the integrated circuit chip and the binding portion of the flexible printed board, and cover at least part of a grounding portion of the flexible printed board; and
an insulating film layer located on a side of the conductive fabric layer facing the integrated circuit chip and the flexible printed board, and configured to cover the integrated circuit chip and the binding portion of the flexible printed board, and avoid the at least part of the grounding portion of the flexible printed board.

2. The display assembly according to claim 1, wherein the insulating film layer is configured to cover a border of the binding portion of the flexible printed board and completely cover the integrated circuit chip, and is adhered to the display module.

3. The display assembly according to claim 2, wherein the composite tape further comprises:
a wave absorbing material layer located on a side of the insulating film layer away from the conductive fabric layer, and configured to cover the integrated circuit chip.

4. The display assembly according to claim 3, wherein a shape of the wave absorbing material layer is similar to a shape of the integrated circuit chip, and the wave absorbing material layer is configured to completely cover the integrated circuit chip.

5. The display assembly according to claim 3, wherein the composite tape further comprises:
a double-sided adhesive layer located on a side of the wave absorbing material layer away from the insulating film layer, an edge of the double-sided adhesive layer being beyond an edge of the wave absorbing material layer and being adhered to the insulating film layer.

6. The display assembly according to claim 1, wherein the grounding portion comprises a first grounding portion close to the binding portion and a second grounding portion away from the binding portion; and
the conductive fabric layer is configured to cover the first grounding portion and be adhered to the first grounding portion.

7. The display assembly according to claim 6, wherein the conductive fabric layer is configured to avoid the second grounding portion.

8. The display assembly according to claim 1, wherein the conductive fabric is further configured to cover a test portion of the flexible printed board; and
the insulating film layer is further configured to cover the test portion of the flexible printed board.

9. The display assembly according to claim 1, wherein the flexible printed board is L-shaped and comprises a first extension portion and a second extension portion, the first extension portion comprises the binding portion, a test portion and a first grounding portion, and the second extension portion comprises a second grounding portion and a component portion;
the conductive fabric layer is configured to at least cover part of the first extension portion and avoid the second grounding portion and the component portion of the second extension portion; and
the insulating film layer is configured to cover part of the first extension portion.

10. The display assembly according to claim 9, wherein in the first extension portion, the binding portion comprises a one-layer metal wiring board, and an edge area on a side opposite to the binding portion comprises a three-layer metal wiring board, and other areas comprise a six-layer metal wiring board; and the second extension portion comprises a six-layer metal wiring board.

11. The display assembly according to claim 9, wherein the conductive fabric layer is configured such that an edge of a side of the conductive fabric layer away from the binding portion of the flexible printed board is spaced from the component portion of the flexible printed board by a distance of 4.7 mm-4.8 mm, and edges of left and right sides of the conductive fabric layer are spaced from borders of left and right sides of the flexible printed board by a distance of 1.2 mm-1.3 mm; and the borders of the left and right sides are borders of two ends in an extending direction of the first extension portion.

12. The display assembly according to claim 1, wherein the insulating film layer is made of a polyester film.

13. The display assembly according to claim 1, wherein the insulating film layer has a thickness of 0.009 mm-0.011 mm.

14. The display assembly according to claim 1, wherein the display module comprises a flexible display panel, the flexible display panel has a binding area, and the binding area is bendable to the back of the display module;

the binding portion of the flexible printed board and the integrated circuit chip are respectively in binding connection with the binding area of the flexible display panel; and the composite tape covers part of the binding area of the flexible display panel and is adhered to the part of the binding area.

15. The display assembly according to claim 1, wherein the display module comprises a display panel and a flexible connecting board with one end in binding connection with the display panel, the flexible connecting board has a binding area, and the binding area is bendable to the back of the display module;

the binding portion of the flexible printed board and the integrated circuit chip are respectively in binding connection with the binding area of the flexible connecting board; and the composite tape covers part of the binding area of the flexible connecting board and is adhered to the part of the binding area.

16. A display device, comprising a display assembly, wherein the display assembly comprises:
  a display module;
  a flexible printed board;
  an integrated circuit chip; and
  a composite tape
  wherein the integrated circuit chip and a binding portion of the flexible printed board are respectively in binding connection with the display module;
  the composite tape is located in a binding area of the display module and is pasted on the integrated circuit chip and the flexible printed board; and
  the composite tape comprises:
    a conductive fabric layer configured to cover the integrated circuit chip and the binding portion of the flexible printed board, and cover at least part of a grounding portion of the flexible printed board; and
    an insulating film layer located on a side of the conductive fabric layer facing the integrated circuit chip and the flexible printed board, and configured to cover the integrated circuit chip and the binding portion of the flexible printed board, and avoid the at least part of the grounding portion of the flexible printed board.

17. The display device according to claim 16, wherein the insulating film layer is configured to cover a border of the binding portion of the flexible printed board and completely cover the integrated circuit chip, and is adhered to the display module.

18. The display device according to claim 17, wherein the composite tape further comprises:
  a wave absorbing material layer located on a side of the insulating film layer away from the conductive fabric layer, and configured to cover the integrated circuit chip.

19. The display device according to claim 18, wherein a shape of the wave absorbing material layer is similar to a shape of the integrated circuit chip, and the wave absorbing material layer is configured to completely cover the integrated circuit chip.

20. The display device according to claim 18, wherein the composite tape further comprises:
  a double-sided adhesive layer located on a side of the wave absorbing material layer away from the insulating film layer, an edge of the double-sided adhesive layer being beyond an edge of the wave absorbing material layer and being adhered to the insulating film layer.

* * * * *